United States Patent
Lim et al.

(10) Patent No.: US 12,457,859 B2
(45) Date of Patent: Oct. 28, 2025

(54) DISPLAY APPARATUS

(71) Applicant: Samsung Display Co., Ltd., Yongin-Si (KR)

(72) Inventors: Danwon Lim, Yongin-si (KR); Hyunjoon Kim, Yongin-si (KR); Bonyong Koo, Yongin-si (KR); Jaeyong Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/395,743

(22) Filed: Dec. 26, 2023

(65) Prior Publication Data
US 2024/0312415 A1 Sep. 19, 2024

(30) Foreign Application Priority Data
Mar. 15, 2023 (KR) .......... 10-2023-0034169

(51) Int. Cl.
| | |
|---|---|
| *H10K 59/123* | (2023.01) |
| *G09G 3/325* | (2016.01) |
| *H10K 59/131* | (2023.01) |
| *H10K 59/179* | (2023.01) |
| *H10K 59/70* | (2023.01) |

(52) U.S. Cl.
CPC .......... *H10K 59/123* (2023.02); *G09G 3/325* (2013.01); *H10K 59/131* (2023.02); *H10K 59/179* (2023.02); *H10K 59/70* (2023.02); *G09G 2300/0426* (2013.01); *G09G 2320/0233* (2013.01)

(58) Field of Classification Search
CPC ............... H10K 59/123; H10K 59/179; H10K 59/1213; H10K 59/1216; H10K 59/131; H10K 59/70; G09G 3/325; G09G 3/3233; G09G 3/3225; G09G 3/3258; G09G 2300/0426; G09G 2300/0819; G09G 2320/0233
See application file for complete search history.

(56) References Cited

U.S. PATENT DOCUMENTS 7,978,156 B2 7/2011 Kim
10,403,704 B2 * 9/2019 Chae .................. H10K 59/1213
(Continued)

FOREIGN PATENT DOCUMENTS

KR 10-0624137 B1 9/2006
KR 10-2021-0128560 A 10/2021
(Continued)

*Primary Examiner* — Xuemei Zheng
(74) *Attorney, Agent, or Firm* — Innovation Counsel LLP

(57) ABSTRACT

A display apparatus includes a light-emitting diode, a driving transistor configured to control a driving current supplied to the light-emitting diode, a compensation transistor connected between a second terminal of the driving transistor and a gate electrode of the driving transistor and configured to compensate for a threshold voltage of the driving transistor, a first connection electrode configured to connect the gate electrode of the driving transistor and a first terminal of the compensation transistor to each other, and a driving voltage line on an insulating layer covering the first connection electrode, covering the gate electrode of the driving transistor, and having an opening overlapping the first connection electrode.

19 Claims, 15 Drawing Sheets

(56) References Cited

U.S. PATENT DOCUMENTS

| | | |
|---|---|---|
| 11,581,382 B2 | 2/2023 | Park et al. |
| 2022/0156477 A1 | 5/2022 | Lee et al. |
| 2024/0213261 A1* | 6/2024 | Wei ..................... G09G 3/3233 |
| 2024/0224637 A1* | 7/2024 | Wang ................. H10K 59/1213 |

FOREIGN PATENT DOCUMENTS

| | | |
|---|---|---|
| KR | 10-2022-0060508 A | 5/2022 |
| KR | 10-2022-0067582 A | 5/2022 |

* cited by examiner

DISPLAY APPARATUS

CROSS-REFERENCE TO RELATED APPLICATION

This application is based on and claims priority under 35 U.S.C. § 119 to Korean Patent Application No. 10-2023-0034169, filed on Mar. 15, 2023, in the Korean Intellectual Property Office, the disclosure of which is incorporated by reference herein in its entirety.

BACKGROUND

1. Field

One or more embodiments relate to a display apparatus, and more particularly, to a display apparatus capable of displaying high-quality images.

2. Description of the Related Art

An organic light-emitting display apparatus includes an organic light-emitting diode as a display element. The organic light-emitting diode includes a pixel electrode, an opposite electrode, and an intermediate layer including an emission layer between the pixel electrode and the opposite electrode. Also, the organic light-emitting display apparatus includes thin-film transistors, capacitors, and/or wires or conductive traces for controlling electrical signals applied to the organic light-emitting diode.

SUMMARY

A display apparatus in the related art has a problem in that luminance deviation occurs due to parasitic capacitance between wires or conductive traces.

One or more embodiments include a display apparatus capable of displaying high-quality images. However, these capabilities are examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a light-emitting diode, a driving transistor configured to control a driving current supplied to the light-emitting diode, a compensation transistor connected between a second terminal of the driving transistor and a gate electrode of the driving transistor and configured to compensate for a threshold voltage of the driving transistor, a first connection electrode configured to connect the gate electrode of the driving transistor and a first terminal of the compensation transistor to each other, and a driving voltage line on an insulating layer covering the first connection electrode, covering the gate electrode of the driving transistor, and having an opening overlapping the first connection electrode.

In an embodiment, the display apparatus may further include a storage capacitor including a first capacitor electrode and a second capacitor electrode disposed on the first capacitor electrode to overlap the first capacitor electrode, a first switching transistor connected between the driving voltage line and a first terminal of the driving transistor, and a compensation reference transistor connected between a connection node line and a reference voltage line, wherein the connection node line connects the second capacitor electrode and a second terminal of the first switching transistor to each other.

In an embodiment, the compensation reference transistor may be turned on according to an emission control signal controlling the first switching transistor.

In an embodiment, each of the compensation reference transistor and the compensation transistor may include an oxide thin-film transistor, and each of the driving transistor and the first switching transistor may include a silicon thin-film transistor.

In an embodiment, the display apparatus may further include a second switching transistor connected between the first switching transistor and the driving transistor, wherein a gate electrode of the first switching transistor may be integrally provided with a gate electrode of the second switching transistor.

In an embodiment, the display apparatus may further include a boost capacitor including a third capacitor electrode connected to a first gate line and a fourth capacitor electrode disposed on the third capacitor electrode to overlap the third capacitor electrode, wherein the driving voltage line may overlap the third capacitor electrode and the fourth capacitor electrode.

In an embodiment, the driving voltage line may overlap a gate electrode of the compensation transistor.

In an embodiment, the display apparatus may further include a first initialization transistor connected between a first initialization voltage line and the gate electrode of the driving transistor, wherein the driving voltage line may overlap a gate electrode of the first initialization transistor.

In an embodiment, the gate electrode of the driving transistor may be positioned inside a boundary of the driving voltage line in a plan view.

In an embodiment, a portion of the driving voltage line may be arranged in a region between a data line and the first connection electrode in a plan view.

In an embodiment, the data line and the driving voltage line may be arranged on the same layer.

In an embodiment, an opening of the driving voltage line may have a rectangular shape in a plan view.

In an embodiment, the display apparatus may further include bridge wires crossing the opening of the driving voltage line.

In an embodiment, the bridge wires may cross each other at a center of the opening of the driving voltage line in a plan view.

In an embodiment, the bridge wires may be arranged to be spaced apart from each other in parallel to a first direction intersecting the first connection electrode.

In an embodiment, an opening of the driving voltage line may have a shape corresponding to a shape of the first connection electrode in a plan view.

In an embodiment, a boundary of the first connection electrode may overlap a boundary of the opening of the driving voltage line in a plan view.

In an embodiment, a boundary of the first connection electrode may be positioned inside a boundary of the opening of the driving voltage line in a plan view.

According to one or more embodiments, a display apparatus includes a first capacitor electrode, a second capacitor electrode on the first capacitor electrode to overlap the first capacitor electrode and having a through hole, a first connection electrode on the second capacitor electrode and electrically connected to the first capacitor electrode through the through hole of the second capacitor electrode, and a driving voltage line on the first connection electrode and having an opening overlapping the first connection electrode.

In an embodiment the display apparatus may further include an oxide semiconductor layer on an insulating layer covering the second capacitor electrode, wherein the first connection electrode may be electrically connected to the oxide semiconductor layer.

Other aspects, features, and advantages other than those described above will now become apparent from the following drawings, claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
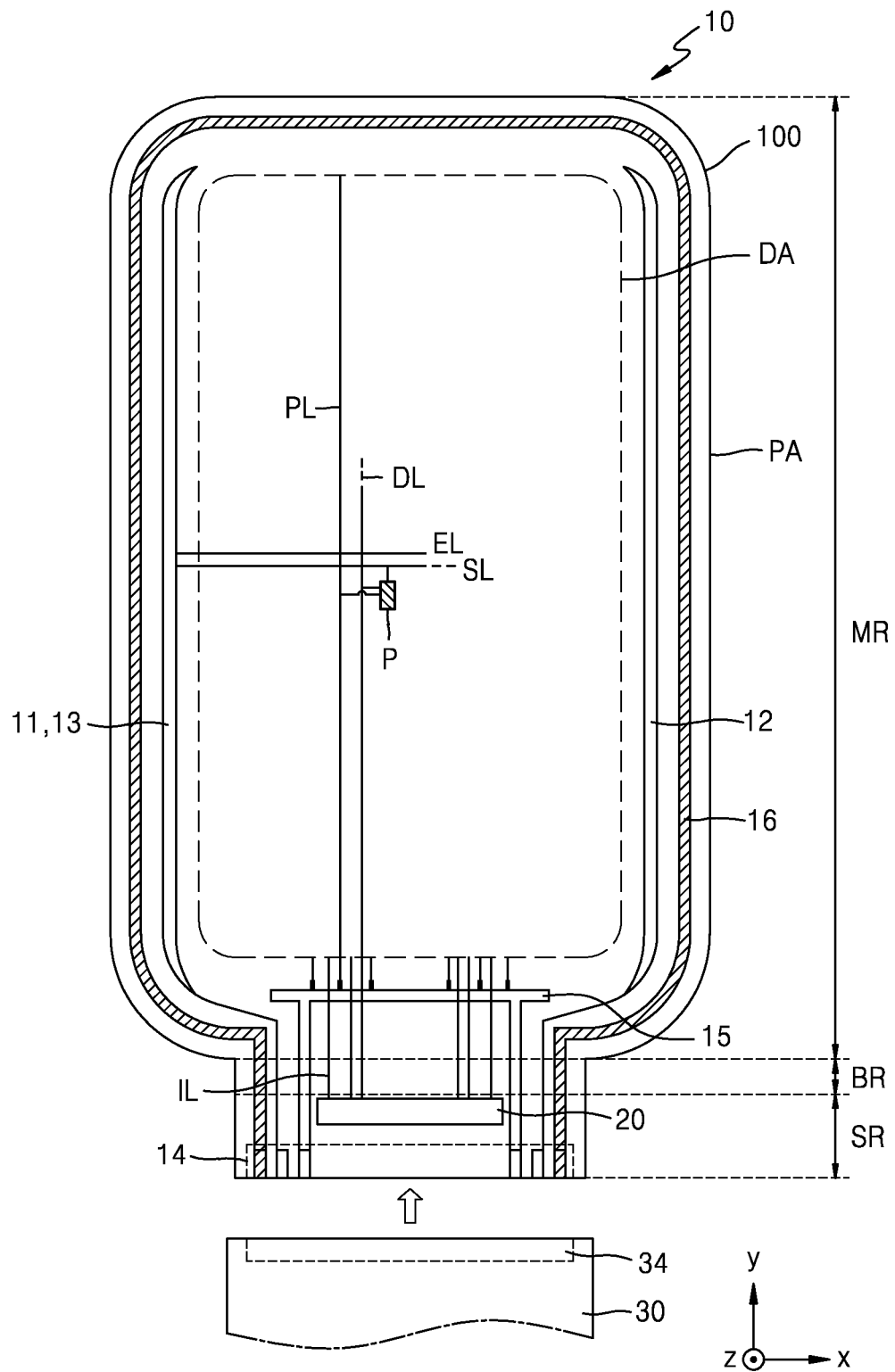
FIG. 1 is a schematic plan view illustrating a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will not be repeated.

In the disclosure, while such terms as "first," "second," etc., may be used to describe and distinguish various elements, such elements are not limited by such terms.

In the disclosure, an expression used in the singular encompasses the expression of the plural, unless it has a clearly different meaning in the context.

In the disclosure, it is to be understood that the terms such as "including" and "having" are intended to indicate the existence of the features, or elements disclosed in the present disclosure, and are not intended to preclude the possibility that one or more other features or elements may exist or may be added.

In the disclosure, it will be understood that when a layer, region, or component is referred to as being formed on another layer, region, or component, it can be directly or indirectly formed on the other layer, region, or component. That is, for example, intervening layers, regions, or components may be present.

In the disclosure, it will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

In the disclosure, "A and/or B" may include "A," "B," or "A and B." In addition, "at least one of A and B" or "at least one selected from A and B" may include "A," "B," or "A and B."

In the disclosure, x, y, and z axes are not limited to being axes of an orthogonal coordinate system and may be interpreted in a broad sense including the same. For example, the x-axis, the y-axis, and the z-axis may be perpendicular to one another, or may represent different directions that are not perpendicular to one another.

In the disclosure, embodiments may be implemented differently, and a specific process order may be performed differently from the described order. For example, two consecutively described processes may be performed substantially at the same time or performed in an order opposite to the described order.

Sizes of components in the drawings may be exaggerated for convenience of explanation. In other words, since sizes and thicknesses of components in the drawings are arbitrarily illustrated for convenience of explanation, the following embodiments are not limited thereto.

FIG. 1 is a schematic plan view of a portion of a display apparatus according to an embodiment. As shown in FIG. 1, the display apparatus includes a display panel 10. The display apparatus may be of any type as long as the display apparatus includes the display panel 10. For example, the display apparatus may be any one of various products such as a smart phone, a tablet, a laptop, a television, a billboard, or the like.

The display panel 10 includes a display area DA and a peripheral area PA outside the display area DA. The display area DA is a portion that displays an image, and a plurality of pixels may be arranged in the display area DA. When viewed in a direction substantially perpendicular to the display panel 10, the display area DA may have any desired shape, such as a circular shape, an elliptical shape, a polygonal shape, or the shape of a specific figure. In FIG. 1, the display area DA is shown to have a substantially rectangular shape with rounded corners.

The peripheral area PA may be outside the display area DA. A width (in an x-axis direction) of a portion of the peripheral area PA may be less than a width (in the x-axis direction) of the display area DA. In this structure, when necessary, at least a portion of the peripheral area PA may be easily bent as described below.

The display panel 10 includes a substrate 100, and the substrate 100 may include the display area DA and the peripheral area PA as described above. Hereinafter, for convenience, the substrate 100 is described as having the display area DA and the peripheral area PA.

Also, when necessary, the display panel 10 may include a main region or area MR, a bending region or area BR outside the main area MR, and a sub-area SR on the side of the bending area BR opposite from the main area MR. In the bending area BR, the display panel 10 may be bent, so that a portion of the sub-area SR may overlap the main area MR when viewed from a z-axis direction. The disclosure is not limited to a bent display apparatus and may also be applied to a display apparatus that is not bent. The sub-area SR may be a non-display area. In an embodiment, the display panel 10 is bent at the bending area BR, so that a non-display area of sub-area SR may not be viewed or a visible area of sub-area SR may be minimal when viewing the display apparatus from a front surface (in a −z direction).

A driving chip 20 or the like may be arranged in the sub-area SR of the display panel 10. The driving chip 20 may include an integrated circuit that drives the display panel 10. The integrated circuit may be a data driving integrated circuit that generates data signals, but the disclosure is not limited thereto.

The driving chip 20 may be mounted in the sub-area SR of the display panel 10. Although the driving chip 20 may be mounted on the same surface as a display surface of the display area DA, as described above, the display panel 10 may be bent at the bending area BR to position the driving chip 20 behind a rear surface of the main area MR.

A printed circuit board 30 or the like may be attached to an end portion of the sub-area SR of the display panel 10. The printed circuit board 30 or the like may be electrically connected to the driving chip 20 or the like through a pad 14 on the substrate 100.

Hereinafter, an organic light-emitting display apparatus is described as an example of the display apparatus according to an embodiment. In another embodiment, the display apparatus of the disclosure may alternatively be an inorganic light-emitting display apparatus (inorganic light-emitting display or inorganic EL display apparatus) or a display apparatus such as a quantum dot light-emitting display apparatus. For example, an emission layer of a display element included in the display apparatus may include an organic material or an inorganic material. Also, the display apparatus may also include an emission layer and a quantum dot layer in a path of light emitted by the emission layer.

As described above, the display panel 10 includes the substrate 100. Various components included on the display panel 10 may be disposed on the substrate 100. The substrate 100 may include glass, metal, or polymer resin. As described above, when the display panel 10 is bent at the bending area BR, the substrate 100 may need to be flexible or bendable. In this case, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including the polymer resin and a barrier layer including an inorganic material (for example, silicon oxide, silicon nitride, silicon oxynitride, or the like) arranged between the two layers, and various modifications may be made.

FIG. 1 illustrates a single pixel P, but the display area DA generally contains multiple pixels P forming an array. Each of the pixels P may be or may include a sub-pixel, which may include a display element such as an organic light-emitting diode (OLED). The pixel P may emit, for example, red, green, blue, or white light.

The pixel P may be electrically connected to outer circuits arranged in the peripheral area PA. For example, a first scan driving circuit 11, a second scan driving circuit 12, an emission control driving circuit 13, a terminal 14, a first power voltage supply line 15, and a second power voltage supply line 16, or the like may be arranged in the peripheral area PA. The first scan driving circuit 11 and the second scan driving circuit 12 may provide scan signals to the pixel P through a scan line SL. The emission control driving circuit 13 may provide an emission control signal to the pixel P through an emission control line EL. The pad 14 arranged in the peripheral area PA of the substrate 100 may be exposed, i.e., not covered by an insulating layer, so that the pad 14 may be electrically connected to the printed circuit board 30. A pad 34 of the printed circuit board 30 may be electrically connected to the pad 14 of the display panel 10.

The printed circuit board 30 may transmit a signal or power from a controller (not shown) to the display panel 10. A control signal generated by the controller may be transmitted to each of the first and second scan driving circuits 11 and 12 and the emission control driving circuit 13 through the printed circuit board 30. Also, the controller may transmit a first power supply voltage to the first power voltage supply line 15 and provide a second power supply voltage to the second power voltage supply line 16. A driving voltage or a first power voltage ELVDD (refer to FIG. 2) may be transmitted to each pixel P through a driving voltage line PL connected to the first power voltage supply line 15, and a common voltage or a second power voltage ELVSS (refer to FIG. 2) may be transmitted to an opposite electrode of the pixel P connected to the second power voltage supply line 16. The second power voltage supply line 16 may have a loop shape with one side open to partially surround the display area DA.

The controller may generate a data signal, and the generated data signal may be transmitted to the pixel P through the driving chip 20 and a data line DL.

Figure 2:
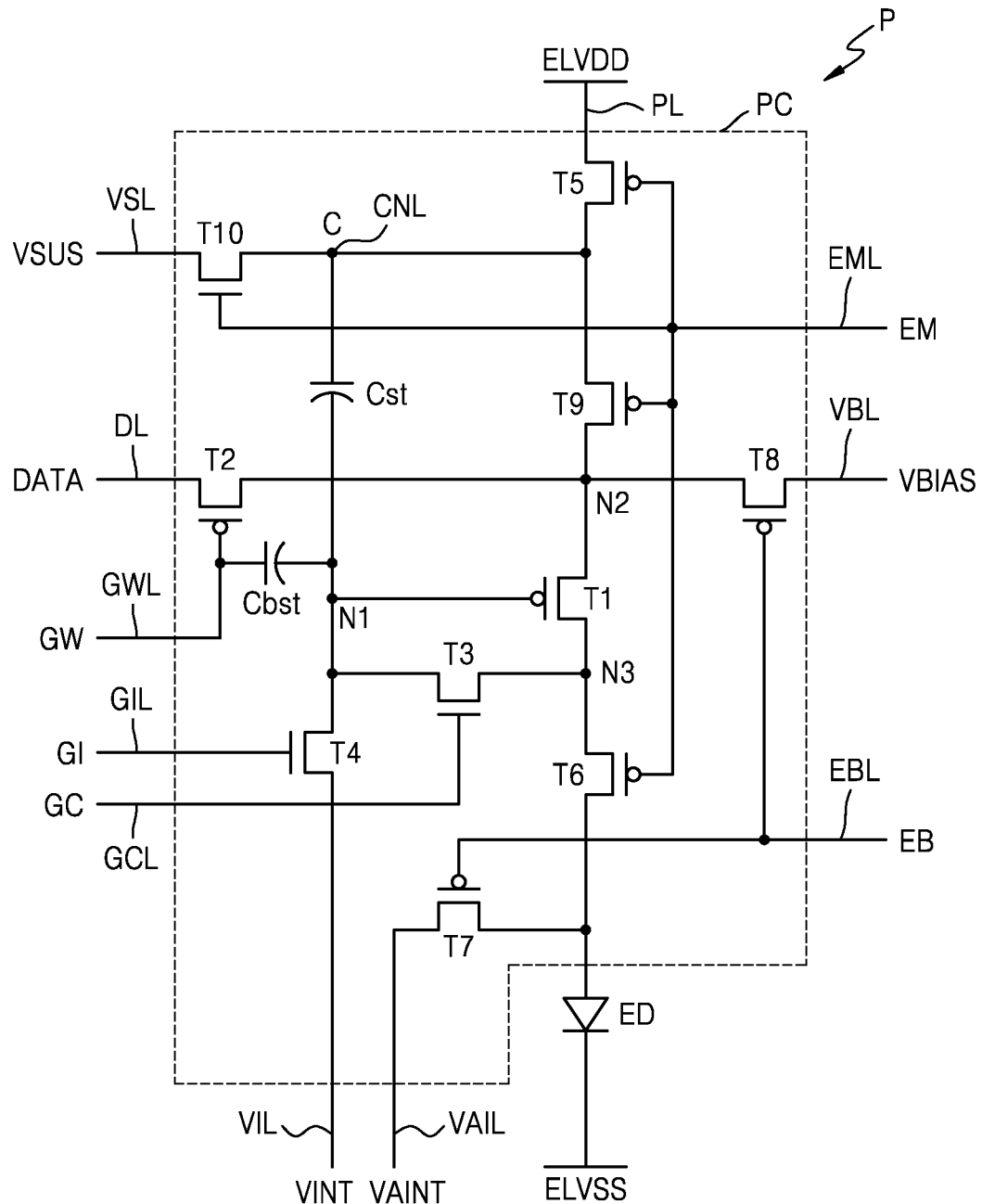
FIG. 2 is an equivalent circuit diagram of a pixel of the display apparatus of FIG. 1.

FIG. 2 is an equivalent circuit diagram of the pixel P of the display apparatus of FIG. 1.

Referring to FIG. 2, the pixel P may include a pixel circuit PC and a light-emitting diode ED, the light-emitting diode ED being a display element connected to the pixel circuit PC.

The pixel circuit PC of the pixel P may include first to tenth transistors T1 to T10, a storage capacitor Cst, a boost capacitor Cbst, and signal lines connected thereto. The signal lines may include the data line DL, a first gate line GWL, a second gate line GCL, a third gate line GIL, a fourth gate line EBL, an emission control signal line EML, a bias voltage line VBL, a reference voltage line VSL, a first initialization voltage line VIL, a second initialization voltage line VAIL, and the driving voltage line PL.

The first transistor T1 may be a driving transistor in which a magnitude of a source-drain current thereof is determined according to a gate-source voltage, and the second to tenth transistors T2 to T10 may each be a switching transistor that is turned on/off according to the gate-source voltage and substantially a gate voltage. The first to tenth transistors T1 to T10 may include thin-film transistors. According to the type (p-type or n-type) of the transistors and/or an operating condition, a first terminal of each the first to tenth transistors T1 to T10 may be a source or drain, and a second terminal thereof may be a terminal different from the first terminal. For example, when the first terminal is a source, the second terminal may be a drain.

The first transistor T1, the second transistor T2, and the fifth to ninth transistors T5 to T9 are p-type silicon thin-film transistors, and the third transistor T3, the fourth transistor T4, and the tenth transistor T10 may be n-type oxide thin-film transistors. An on-voltage of a gate signal for turning on the first transistor T1, the second transistor T2, and the fifth to ninth transistors T5 to T9 may be a low-level voltage (a second level voltage). An on-voltage of a gate signal for turning on the third transistor T3, fourth transistor T4, and tenth transistor T10 may be a high-level voltage (a first level voltage).

The first transistor T1 may be connected between the driving voltage line PL and the light-emitting diode ED. The first transistor T1 may be connected to the driving voltage line PL via the ninth transistor T9 and the fifth transistor T5 and may be electrically connected to the light-emitting diode ED via the sixth transistor T6. The first transistor T1 includes a gate electrode connected to a first node N1, a first terminal connected to a second node N2, and a second terminal connected to a third node N3. The first transistor T1 may receive a data signal DATA according to a switching operation of the second transistor T2 and supply a driving current to the light-emitting diode ED.

The second transistor T2 (a data write transistor) may be connected between the data line DL and the second node N2. The second transistor T2 may include a gate electrode connected to the first gate line GWL, a first terminal connected to the data line DL, and a second terminal connected to the second node N2. The second transistor T2 may be turned on according to a first gate signal GW received through the first gate line GWL and may perform a switching operation of providing the data signal DATA from the data line DL to the second node N2.

The third transistor T3 (a compensation transistor) may be connected between the first node N1 and the third node N3. In other words, the third transistor T3 may be connected between the gate electrode of the first transistor T1 and the second terminal of the first transistor T1. The third transistor T3 may be connected to the light-emitting diode ED via the sixth transistor T6. The third transistor T3 may include a gate electrode connected to the second gate line GCL, a first terminal connected to the first node N1, and a second terminal connected to the third node N3. The third transistor T3 may compensate a threshold voltage of the first transistor T1 by diode-connecting the first transistor T1.

The fourth transistor T4 (a first initialization transistor) may be connected between the first node N1 and the first initialization voltage line VIL. The fourth transistor T4 may include a gate electrode connected to the third gate line GIL, a first terminal connected to the first node N1, and a second terminal connected to the first initialization voltage line VIL. The fourth transistor T4 may be turned on according to a third gate signal GI received through the third gate line GIL, causing the fourth transistor T4 to provide a first initialization voltage VINT of the first initialization voltage line VIL to the first node N1 to initialize the gate electrode of the first transistor T1.

The fifth transistor T5 (a first switching transistor) may be connected between the driving voltage line PL and the ninth transistor T9. The sixth transistor T6 (a third switching transistor) may be connected between the third node N3 and the light-emitting diode ED. The ninth transistor T9 (a second switching transistor) may be connected between the fifth transistor T5 and the second node N2.

The fifth transistor T5 may include a gate electrode connected to the emission control signal line EML, a first terminal connected to the driving voltage line PL, and a second terminal connected to a C node C through a connection node line CNL. The sixth transistor T6 may include a gate electrode connected to the emission control signal line EML, a first terminal connected to the third node N3, and a second terminal connected to a pixel electrode of the light-emitting diode ED. The ninth transistor T9 may include a gate electrode connected to the emission control signal line EML, a first terminal connected to the C node C through the connection node line CNL, and a second terminal connected to the second node N2. When the fifth transistor T5, the sixth transistor T6, and the ninth transistor T9 are simultaneously turned on according to an emission control signal EM received through the emission control signal line EML, a driving current may flow through the light-emitting diode ED.

The seventh transistor T7 (a second initialization transistor) may be connected between the light-emitting diode ED and the second initialization voltage line VAIL. The seventh transistor T7 may include a gate electrode connected to the fourth gate line EBL, a first terminal connected to the second initialization voltage line VAIL, and a second terminal connected to the second terminal of the sixth transistor T6 and the pixel electrode of the light-emitting diode ED. The seventh transistor T7 may be turned on according to a fourth gate signal EB received through the fourth gate line EBL and configured to transmit a second initialization voltage VAINT to the pixel electrode of the light-emitting diode ED to initialize a voltage of the pixel electrode of the light-emitting diode ED.

The eighth transistor T8 (a bias control transistor) may be connected between the second node N2 and the bias voltage line VBL. The eighth transistor T8 may include a gate electrode connected to the fourth gate line EBL, a first terminal connected to the second node N2, and a second terminal connected to the bias voltage line VBL. The eighth transistor T8 may be turned on according to the fourth gate signal EB received through the fourth gate line EBL and configured to transmit a bias voltage VBIAS to the first terminal of the first transistor T1 to control a gate-source voltage of the first transistor T1.

The tenth transistor T10 (a compensation reference transistor) may be connected between the C node C and the reference voltage line VSL. The tenth transistor T10 may include a gate electrode connected to the emission control signal line EML, a first terminal connected to the reference voltage line VSL, and a second terminal connected to the C node C through a connection node line CNL. The tenth transistor T10 may be turned on according to the emission control signal EM received through the emission control signal line EML and configured to transmit a reference voltage VSUS to the C node C to initialize the C node C. For example, when the emission control signal EM received through the emission control signal line EML is a low-level voltage, the fifth transistor T5, the sixth transistor T6, and the ninth transistor T9 may be turned on, so that the first power voltage ELVDD may be applied to the first terminal of the first transistor T1. On the contrary, when the emission control signal EM received through the emission control signal line EML is a high-level voltage, the tenth transistor T10 may be turned on, and the reference voltage VSUS may be applied to the first terminal of the first transistor T1.

As a comparative example, when a first power voltage is supplied to a first terminal of a driving transistor to compensate for a threshold voltage deviation of the driving transistor, a luminance deviation may occur due to a voltage drop (IR-drop) of the first power voltage ELVDD between a pixel close to the first power voltage supply line 15 (refer to FIG. 1) and a pixel far away to the first power voltage supply line 15. To compensate for a threshold voltage deviation of the first transistor T1, which is a driving transistor, embodiments provide a display apparatus capable of displaying high-quality images with reduced luminance deviation as the reference voltage VSUS is supplied to the first terminal of the first transistor T1.

The storage capacitor Cst may be connected between the C node C and the first node N1. A first terminal (a first capacitor electrode) of the storage capacitor Cst may be connected to the gate electrode of the first transistor T1. A second terminal (a second capacitor electrode) of the storage capacitor Cst may be connected to the C node C through a connection node line CNL.

The boost capacitor Cbst may be connected between the first gate line GWL and the first node N1. A first terminal (a third capacitor electrode) of the boost capacitor Cbst may be connected to the first gate line GWL, and a second terminal thereof (a fourth capacitor electrode) may be connected to the first node N1. In an embodiment, the boost capacitor Cbst may be omitted.

The light-emitting diode ED may include the pixel electrode (e.g., an anode) and an opposite electrode (e.g., a cathode), and the opposite electrode may receive the second power voltage ELVSS. The light-emitting diode ED may display an image by receiving a driving current corresponding to the data signal DATA from the first transistor T1 to emit a certain color of light.

Figure 3:
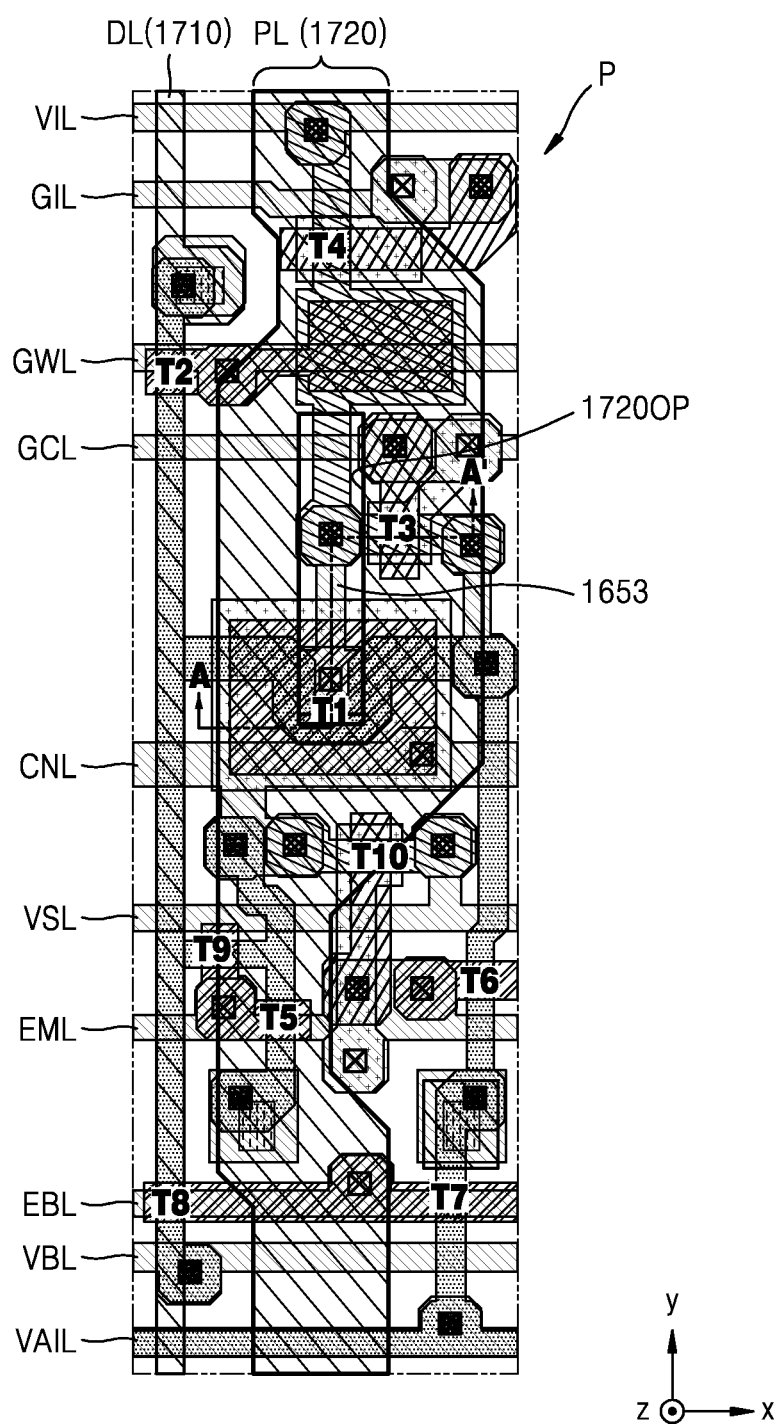
FIG. 3 is a schematic layout diagram illustrating a pixel of the display apparatus of FIG. 1.
Figure 11:
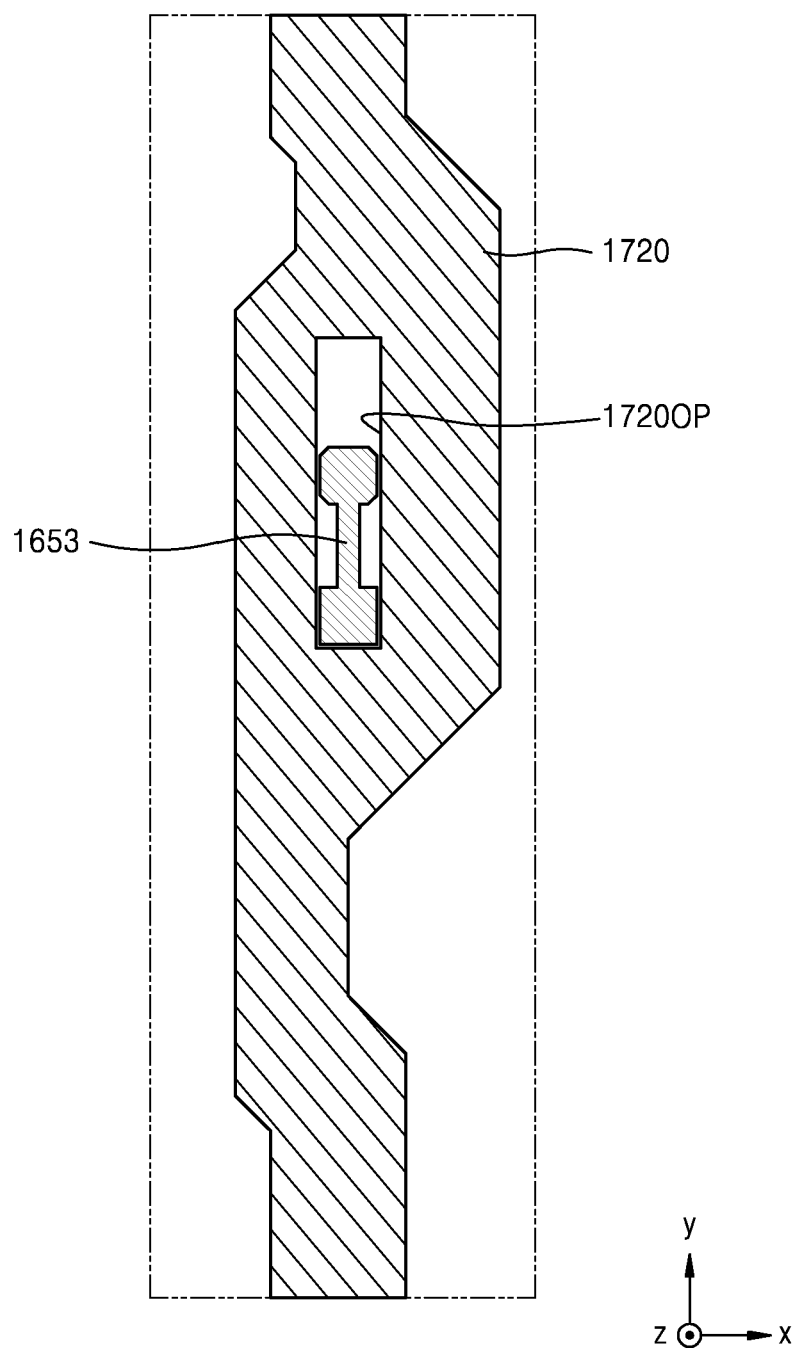
FIG. 11 is a schematic plan view illustrating a first connection electrode and a driving voltage line of a pixel of a display apparatus according to an embodiment.
Figure 12:
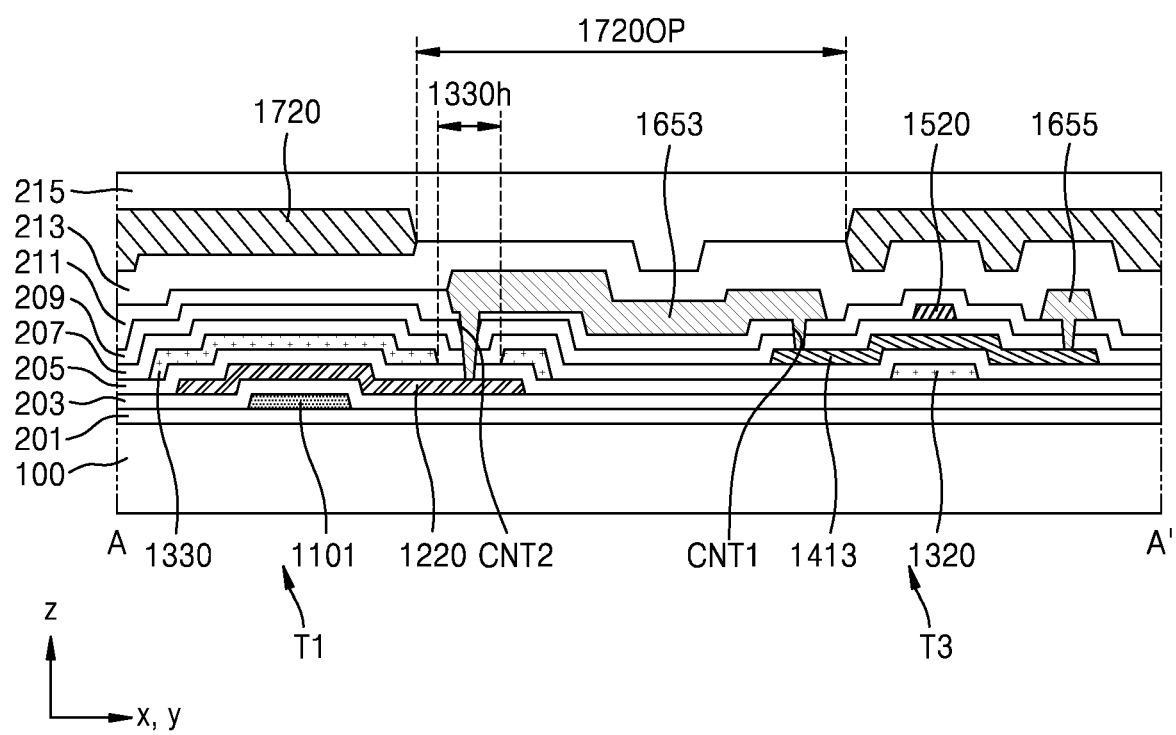
FIG. 12 is a schematic cross-sectional view of the display apparatus taken along a line A-A' of FIG. 3.

FIG. 3 is a schematic layout diagram illustrating the pixel P of the display apparatus of FIG. 1. FIGS. 4 to 10 are plan views each schematically illustrating layers included in the layout of FIG. 3. FIG. 11 is a schematic plan view illustrating a connection electrode and a driving voltage line of a pixel of a display apparatus according to an embodiment, and FIG. 12 is a schematic cross-sectional view of the display apparatus taken along a line A-A' of FIG. 3.

The display apparatus may include multiple pixels P forming an array. Each of the pixels P may contain integrated structures having shapes that are the same or similar to the shapes shown in FIG. 3. However, the disclosure is not limited thereto, and the pixels P may have various configurations different from each other.

The structures having the shapes shown in FIG. 3 may overly a buffer layer 201 (refer to FIG. 12) including a material such as silicon oxide, silicon nitride, or silicon oxynitride on the substrate 100. The buffer layer 201 may prevent diffusion of metal atoms or impurities between the substrate 100 and components on the substrate 100.

Figure 4:
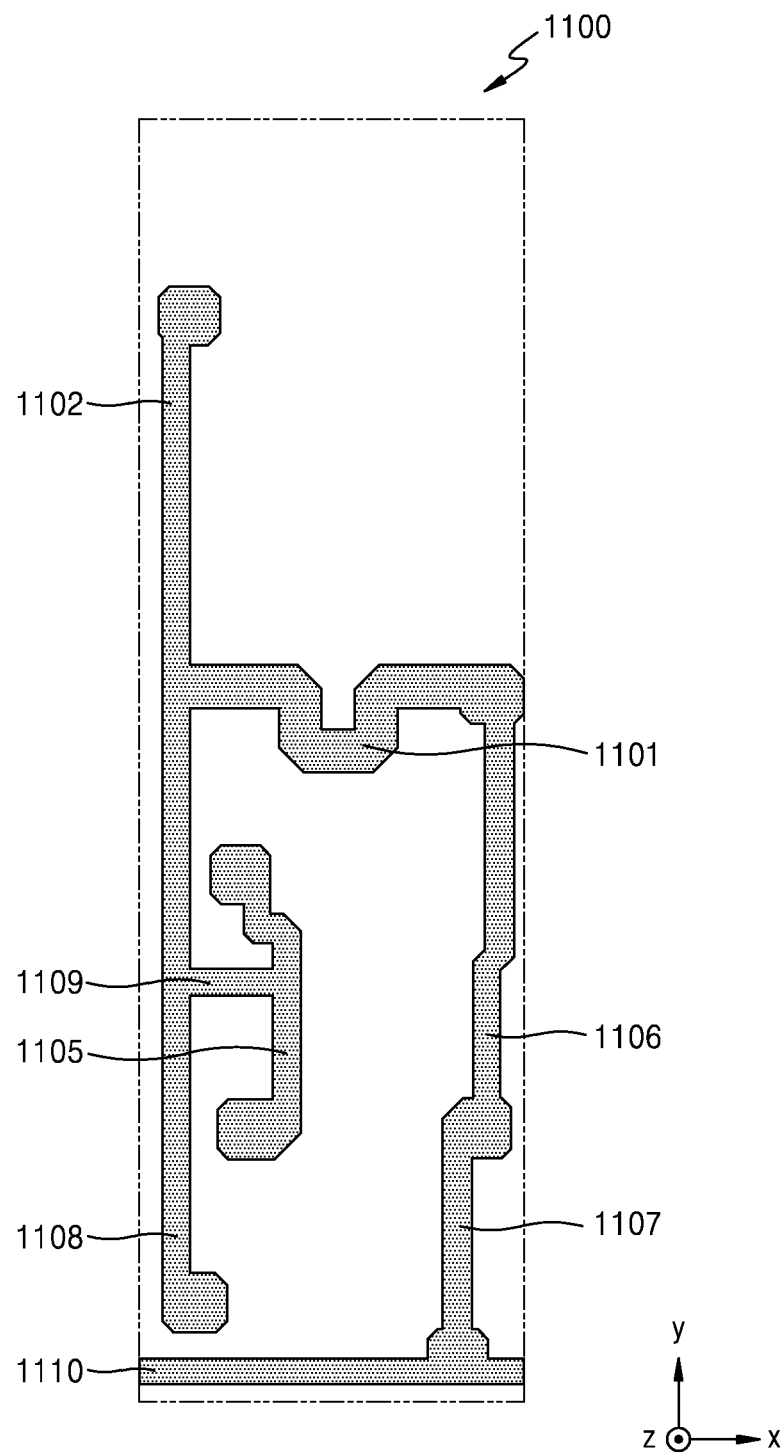
FIGS. 4, 5, 6, 7, 8, 9, and 10 are plan views each schematically illustrating layers included in the layout of FIG. 3.

A first semiconductor layer 1100 (a silicon semiconductor layer) may be on the buffer layer 201. The first semiconductor layer 1100 may include amorphous silicon or poly-silicon. The first transistor T1, the second transistor T2, and the fifth to ninth transistors T5 to T9 as described above are positioned along the first semiconductor layer 1100. As described above, the first transistor T1, the second transistor T2, and the fifth to ninth transistors T5 to T9 may be p-type thin-film transistors. In FIG. 4, a layout or one pattern of the first semiconductor layer 1100 in one pixel P is shown. For example, the first semiconductor layer 1100 may include a channel region 1101 of the first transistor T1, a channel region 1102 of the second transistor T2, a channel region 1105 of the fifth transistor T5, a channel region 1106 of the sixth transistor T6, a channel region 1107 of the seventh transistor T7, a channel region 1108 of the eighth transistor T8, and a channel region 1109 of the ninth transistor T9. Each of the channel regions 1101, 1102, 1105, 1106, 1107, 1108, and 1109 may be a region where gate electrodes of a first gate layer 1200 and the first semiconductor layer 1100 overlap each other. A source region and a drain region may respectively be adjacent to opposite sides of each channel region, and a portion of each of the source region and the drain region may extend to function as a source region or a drain region of a neighboring transistor. The first semiconductor layer 1100 may also include a lower voltage line 1110 extending in a first direction (an x-axis direction).

A first gate insulating film 203 (refer to FIG. 12) may be on the first semiconductor layer 1100. The first gate insulating film 203 may include an insulating material. For example, the first gate insulating film 203 may include an inorganic insulating layer, such as silicon oxide, silicon nitride, silicon oxynitride, aluminum oxide, or the like.

Figure 5:
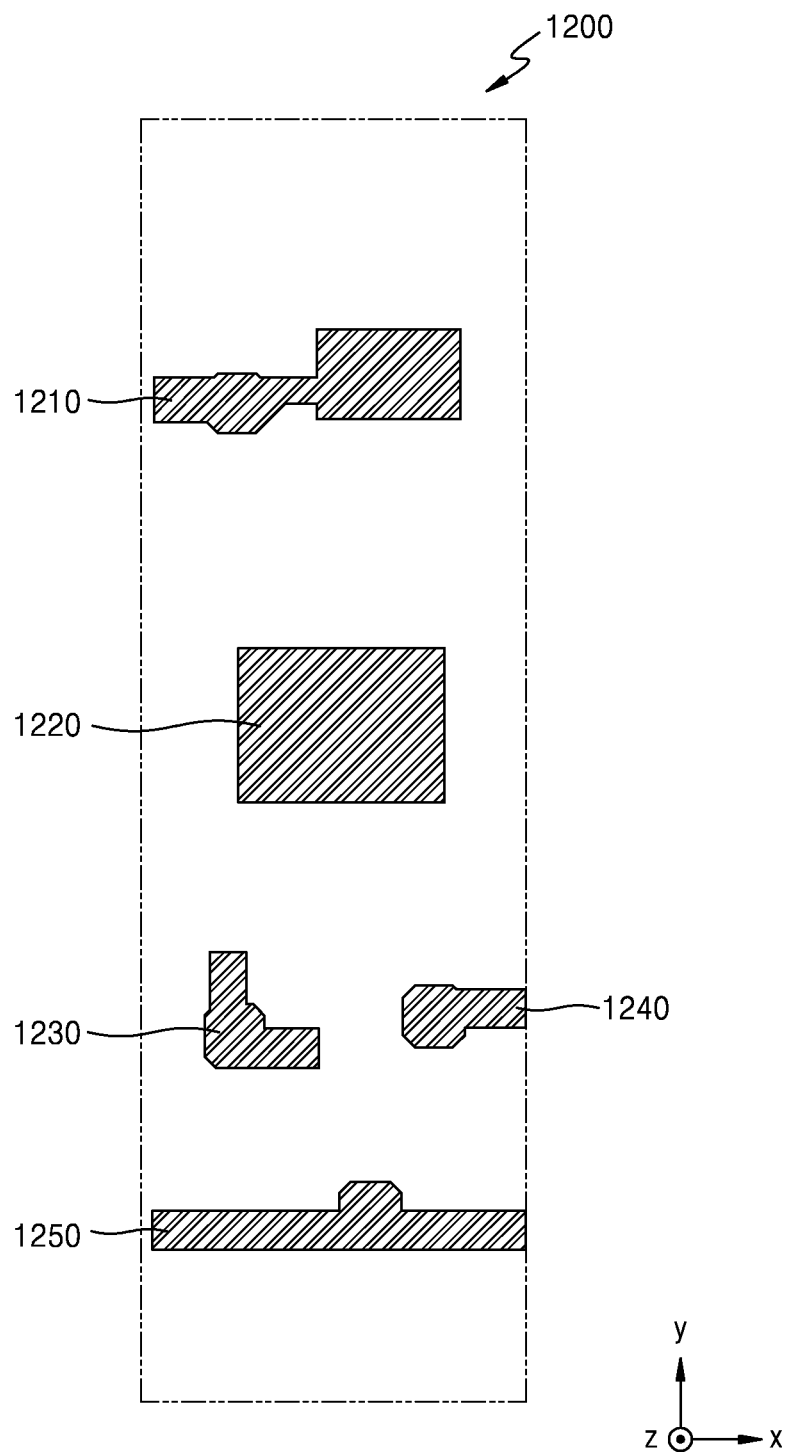

The first gate layer 1200 may be on the first gate insulating film 203. Referring to FIG. 5, the first gate layer 1200 may include a first gate electrode 1210, a second gate electrode 1220, a third gate electrode 1230, a fourth gate electrode 1240, and a fifth gate electrode 1250. The first gate electrode 1210, the second gate electrode 1220, the third gate electrode 1230, and the fourth gate electrode 1240 may each have an isolated shape by being spaced apart from each other. The fifth gate electrode 1250 may be connected to the fifth gate electrode 1250 of a neighboring pixel.

The first gate layer 1200 may include a metal, an alloy, a conductive metal oxide, a transparent conductive material, or the like. For example, the first gate layer 1200 may include silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. The first gate layer 1200 may have a single-layered structure or a multi-layered structure including two or more layers of the above-described materials.

The first gate electrode 1210 may overlap the channel region 1102 of the second transistor T2 in a plan view. The first gate electrode 1210 may include a gate electrode of the second transistor T2, which is a data write transistor, and a third capacitor electrode of the boost capacitor Cbst (see FIG. 2).

The second gate electrode 1220 may overlap the channel region 1101 of the first transistor T1 in a plan view. The second gate electrode 1220 may include a gate electrode of the first transistor T1, which is a driving transistor, and may function as a first capacitor electrode of the storage capacitor Cst (see FIG. 2). For example, the gate electrode of the first transistor T1 may be integrally provided with the first capacitor electrode of the storage capacitor Cst.

The third gate electrode 1230 may overlap the channel region 1105 of the fifth transistor T5 and the channel region 1109 of the ninth transistor T9 in a plan view. The third gate electrode 1230 may include a gate electrode of the fifth transistor T5, which is a first switching transistor, and a gate electrode of the ninth transistor T9, which is a second switching transistor. That is, the gate electrode of the fifth transistor T5 and the gate electrode of the ninth transistor T9 may be integrally provided.

The fourth gate electrode 1240 may overlap the channel region 1106 of the sixth transistor T6 in a plan view. The fourth gate electrode 1240 may include a gate electrode of the sixth transistor T6, which is a third switching transistor.

The fifth gate electrode 1250 may overlap the channel region 1107 of the seventh transistor T7 and the channel region 1108 of the eighth transistor T8 in a plan view. The fifth gate electrode 1250 may include a gate electrode of the seventh transistor T7, which is a second initialization transistor, and a gate electrode of the eighth transistor T8, which is a bias control transistor.

A second gate insulating film 205 (refer to FIG. 12) may be on the first gate layer 1200. The second gate insulating film 205 may include an insulating material. For example, the second gate insulating film 205 may include an inorganic insulating layer, such as a layer of silicon oxide, silicon nitride, silicon oxynitride, aluminum oxide, or the like.

Figure 6:
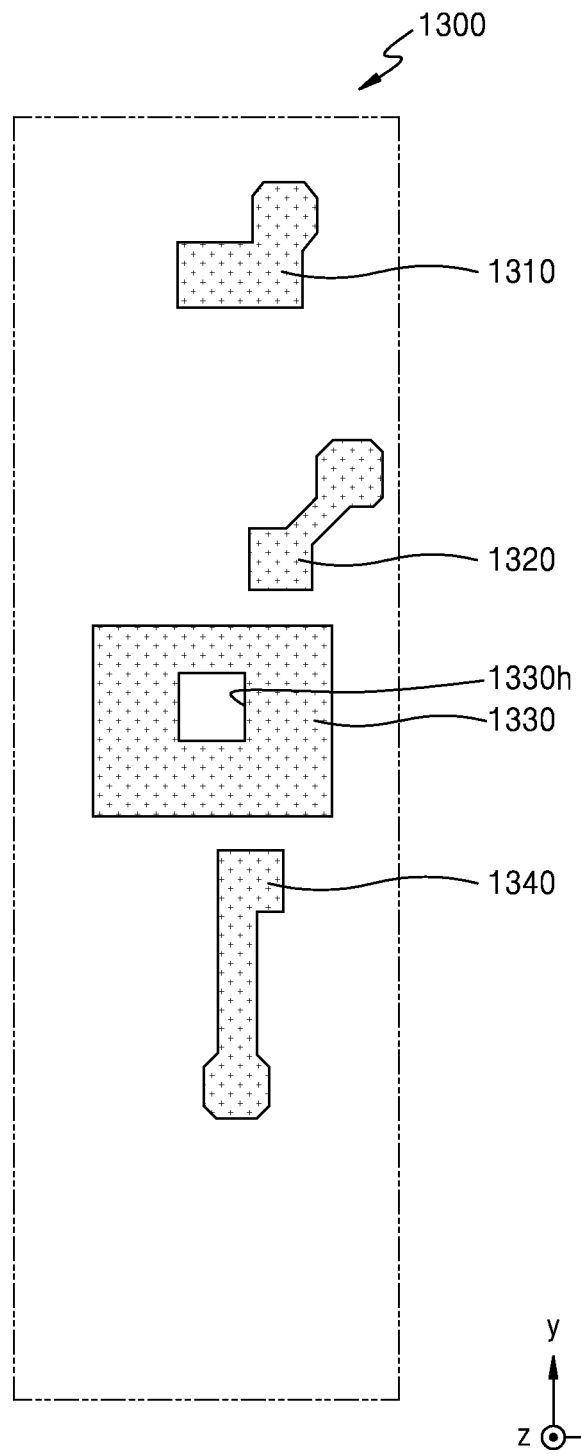

A second gate layer 1300 may be on the second gate insulating film 205. Referring to FIG. 6, the second gate layer 1300 may include a sixth gate electrode 1310, a seventh gate electrode 1320, a second capacitor electrode 1330, and an eighth gate electrode 1340. The sixth gate electrode 1310, the seventh gate electrode 1320, the second capacitor electrode 1330, and the eighth gate electrode 1340 may each have an isolated shape by being spaced apart from each other.

The second gate layer 1300 may include a metal, an alloy, a conductive metal oxide, a transparent conductive material, or the like. For example, the second gate layer 1300 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The second gate layer 1300 may have a single-layered structure or a multi-layered structure including two or more layers of the above-described materials.

The sixth gate electrode 1310 may include a lower gate electrode of the fourth transistor T4, which is a first initialization transistor.

The seventh gate electrode 1320 may include a lower gate electrode of the third transistor T3, which is a compensation transistor.

The second capacitor electrode 1330 may include a second capacitor electrode of the storage capacitor Cst and may have a through hole 1330h penetrating the second capacitor electrode 1330. The second capacitor electrode 1330 may be on the second gate electrode 1220 to overlap the second gate electrode 1220 in a plan view.

The eighth gate electrode 1340 may include a lower gate electrode of the tenth transistor T10, which is a compensation transistor.

The third transistor T3, the fourth transistor T4, and the tenth transistor T10 may each be a double gate transistor including two gate electrodes on different layers and overlapping each other. Lower gate electrodes on the second gate layer 1300 and upper gate electrodes on a third gate layer 1500 to be described below may be positioned to face each other with an oxide semiconductor therebetween.

The oxide semiconductor is sensitive to light, so fluctuations in an amount of current may occur due to light from the outside, and thus the lower gate electrode below the oxide semiconductor may absorb or reflect external light.

A third gate insulating film 207 (refer to FIG. 12) may be on the second gate layer 1300. The third gate insulating film 207 may include an insulating material. For example, the third gate insulating film 207 may include an inorganic insulating layer, such as a layer of silicon oxide, silicon nitride, silicon oxynitride, aluminum oxide, or the like.

Figure 7:
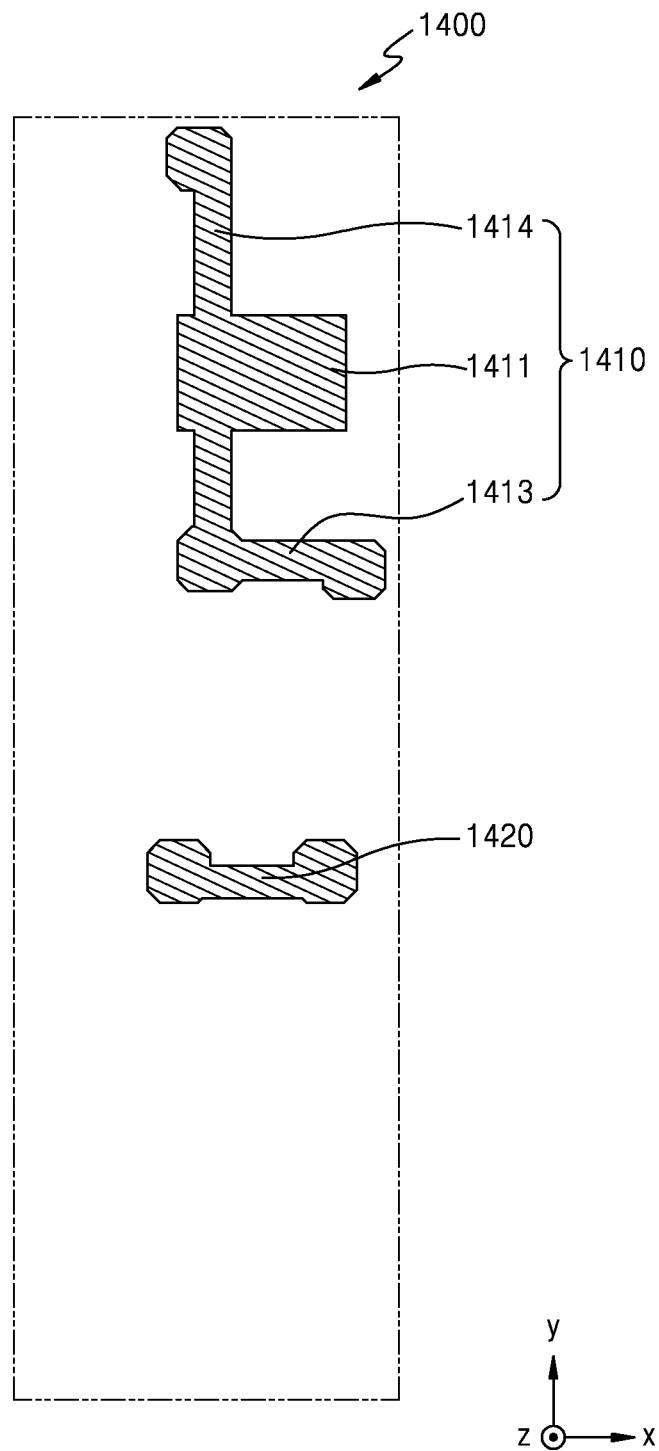

A second semiconductor layer 1400 (an oxide semiconductor layer) may be on the third gate insulating film 207. Referring to FIG. 7, the second semiconductor layer 1400 may include a first semiconductor pattern 1410 and a second semiconductor pattern 1420. The first semiconductor pattern 1410 and the second semiconductor pattern 1420 may each have an isolated shape by being spaced apart from each other.

The second semiconductor layer 1400 may include an oxide semiconductor. The second semiconductor layer 1400 may include a Zn oxide-based material, such as Zn oxide, In—Zn oxide, Ga—In—Zn oxide, or the like. Alternatively, the second semiconductor layer 1400 may include In—Ga—Zn—O (IGZO), In—Sn—Zn—O (ITZO), or In—Ga—Sn—Zn—O (IGTZO), which includes a metal, such as indium (In), gallium (Ga), or tin (Sn), in zinc oxide (ZnO$_x$:ZnO or ZnO$_2$).

The first semiconductor pattern 1410 may overlap the sixth gate electrode 1310 and the first gate electrode 1210 in a plan view. The first semiconductor pattern 1410 may include a channel region 1414 of the fourth transistor T4, a fourth capacitor electrode 1411 of the boost capacitor Cbst, and a channel region 1413 of the third transistor T3.

A channel region 1420 of the tenth transistor T10 may overlap the seventh gate electrode 1320 in a plan view. The second semiconductor pattern 1420 may include a channel region of the tenth transistor T10.

As described above, the channel regions of the third transistor T3, the fourth transistor T4, and the tenth transistor T10 may each include an oxide semiconductor. Because an oxide semiconductor has high carrier mobility and low leakage current, a voltage drop is not large even when a driving time is long. Accordingly, as the third transistor T3, the fourth transistor T4, and the tenth transistor T10 are provided as oxide thin-film transistors, a display apparatus in which leakage current is prevented from occurring and power consumption is reduced may be implemented.

A fourth gate insulating film 209 (refer to FIG. 12) may be on the second semiconductor layer 1400. The fourth gate insulating film 209 may include an insulating material. For example, the fourth gate insulating film 209 may include an inorganic insulating layer, such as a layer of silicon oxide, silicon nitride, silicon oxynitride, aluminum oxide, or the like.

Figure 8:
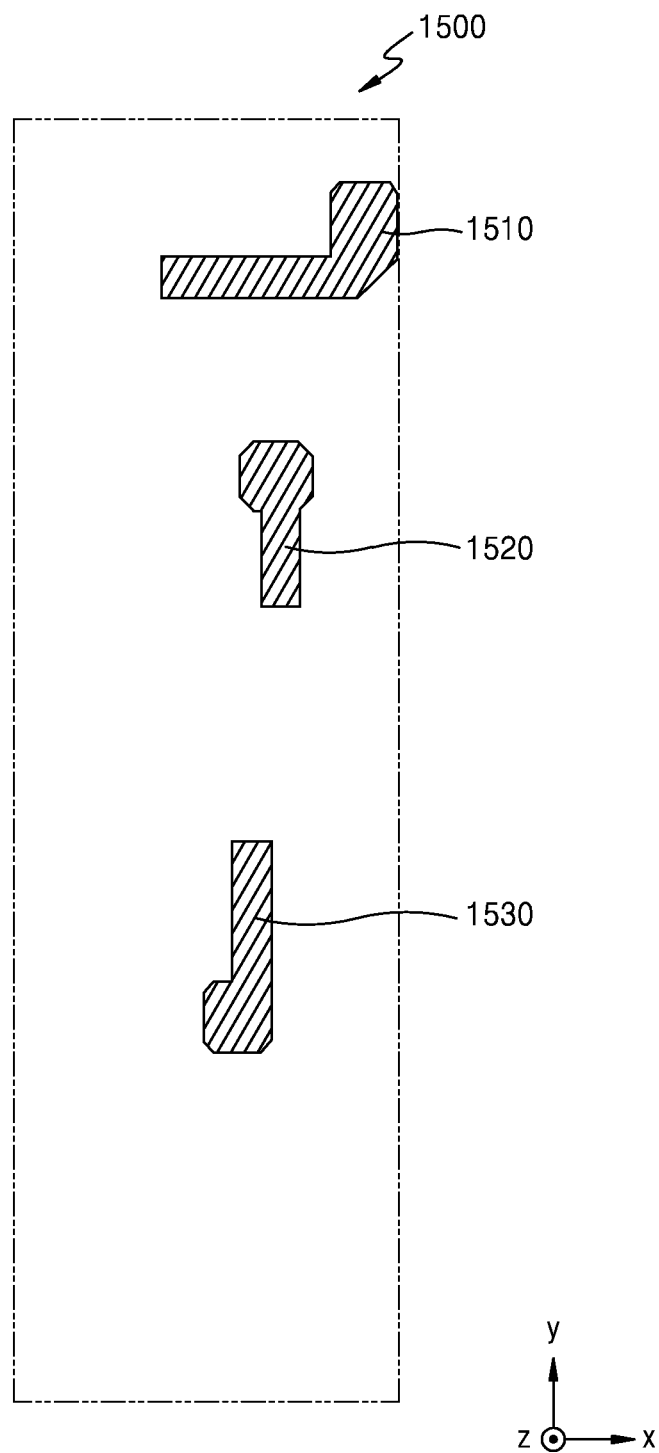

The third gate layer 1500 may be on the fourth gate insulating film 209. Referring to FIG. 8, the third gate layer 1500 may include a ninth gate electrode 1510, a tenth gate electrode 1520, and an eleventh gate electrode 1530. The ninth gate electrode 1510, the tenth gate electrode 1520, and the eleventh gate electrode 1530 may each have an isolated shape by being spaced apart from each other.

The third gate layer 1500 may include a metal, an alloy, a conductive metal oxide, a transparent conductive material, or the like. For example, the third gate layer 1500 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The third gate layer 1500 may have a single-layered structure or a multi-layered structure including two or more layers of the above-described materials.

The ninth gate electrode 1510 may overlap the channel region 1414 of the fourth transistor T4 in a plan view. The ninth gate electrode 1510 may include an upper gate electrode of the fourth transistor T4.

The tenth gate electrode 1520 may overlap the channel region 1413 of the third transistor T3 in a plan view. The tenth gate electrode 1520 may include an upper gate electrode of the third transistor T3.

The eleventh gate electrode 1530 may overlap the channel region 1420 of the tenth transistor T10 in a plan view. The eleventh gate electrode 1530 may include an upper gate electrode of the tenth transistor T10.

A first interlayer insulating film 211 (refer to FIG. 12) may be on the third gate layer 1500. The first interlayer insulating film 211 may include an insulating material. For example, the first interlayer insulating film 211 may include an inorganic insulating layer such as a layer of silicon oxide, silicon nitride, silicon oxynitride, or the like.

Figure 9:
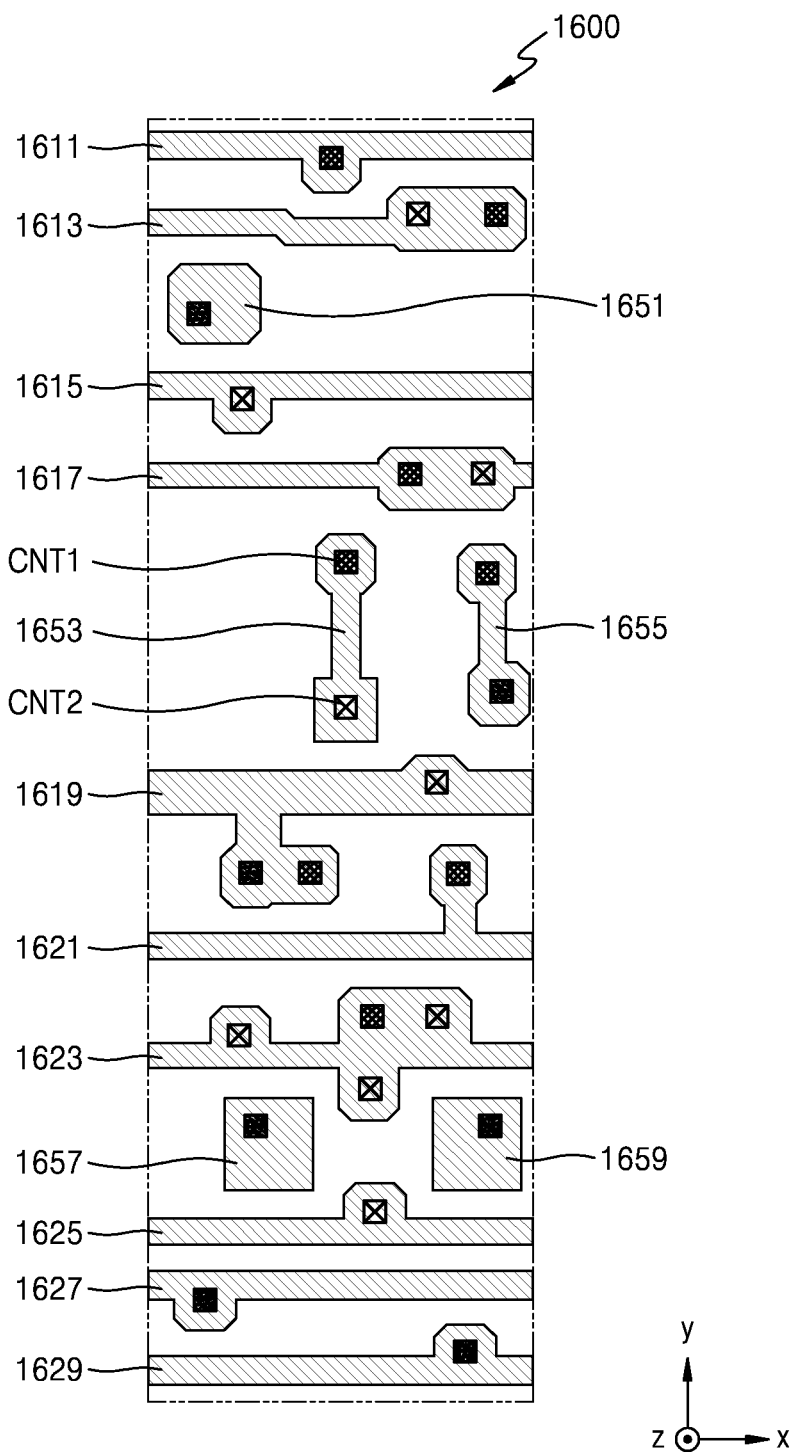

A first metal layer 1600 may be on the first interlayer insulating film 211. Referring to FIG. 9, the first metal layer 1600 may include a first initialization voltage line 1611 (corresponding to VIL of FIG. 2), a third gate line 1613 (corresponding to GIL of FIG. 2), a first gate line 1615 (corresponding to GWL of FIG. 2), a second gate line 1617 (corresponding to GCL of FIG. 2), a connection node line 1619 (corresponding to CNL of FIG. 2), a reference voltage line 1621 (corresponding to VSL of FIG. 2), an emission control signal line 1623 (corresponding to EML of FIG. 2), a fourth gate line 1625 (corresponding to EBL of FIG. 2), a bias voltage line 1627 (corresponding to VBL of FIG. 2), and an upper voltage line 1629 (corresponding to VAIL of FIG. 2), which may generally extend in a first direction (an x-axis direction) in a pixel array. The upper voltage line 1629 may be a part of the second initialization voltage line VAIL.

The first initialization voltage line 1611 may be connected to the first semiconductor pattern 1410 of the second semiconductor layer 1400 through a contact hole. The first initialization voltage line 1611 may transfer the first initialization voltage VINT (refer to FIG. 2) to the second terminal of the fourth transistor T4.

The third gate line 1613 may be connected to the sixth gate electrode 1310 of the second gate layer 1300 and the ninth gate electrode 1510 of the third gate layer 1500 through a contact hole. The third gate line 1613 may transfer the third gate signal GI (refer to FIG. 2) to the lower gate electrode and the upper gate electrode of the fourth transistor T4.

The first gate line 1615 may be connected to the first gate electrode 1210 of the first gate layer 1200 through a contact hole. The first gate line 1615 may transfer the first gate signal GW (refer to FIG. 2) to the gate electrode of the second transistor T2 and the third capacitor electrode of the boost capacitor Cbst.

The second gate line 1617 may be connected to the seventh gate electrode 1320 of the second gate layer 1300 and the tenth gate electrode 1520 of the third gate layer 1500 through a contact hole. The second gate line 1617 may transfer the second gate signal GC (refer to FIG. 2) to the lower gate electrode and the upper gate electrode of the third transistor T3.

The connection node line 1619 may be connected to a semiconductor pattern of the first semiconductor layer 1100, the second capacitor electrode 1330 of the second gate layer 1300, and the second semiconductor pattern 1420 of the second semiconductor layer 1400 through a contact hole.

The reference voltage line 1621 may be connected to the second semiconductor pattern 1420 of the second semiconductor layer 1400 through a contact hole. The reference voltage line 1621 may transfer the reference voltage VSUS (refer to FIG. 2) to the first terminal of the tenth transistor T10.

The emission control signal line 1623 may be connected to the third gate electrode 1230 and the fourth gate electrode 1240 of the first gate layer 1200, the eighth gate electrode 1340 of the second gate layer 1300, and the eleventh gate electrode 1530 of the third gate layer 1500 through a contact hole. The emission control signal line 1623 may transfer the emission control signal EM (refer to FIG. 2) to the gate electrode of the fifth transistor T5, the gate electrode of the ninth transistor T9, the gate electrode of the sixth transistor T6, and the lower gate electrode and the upper gate electrode of the tenth transistor T10.

The fourth gate line 1625 may be connected to the fifth gate electrode 1250 of the first gate layer 1200 through a contact hole. The fourth gate line 1625 (refer to EBL of FIG. 2) may transfer the fourth gate signal EB (refer to FIG. 2) to the gate electrode of the seventh transistor T7 and the gate electrode of the eighth transistor T8.

The bias voltage line 1627 may be connected to a semiconductor pattern of the first semiconductor layer 1100 through a contact hole. The bias voltage line 1627 may transfer the bias voltage VBIAS (refer to FIG. 2) to the second terminal of the eighth transistor T8.

The upper voltage line 1629 may be connected to the semiconductor pattern of the first semiconductor layer 1100. The upper voltage line 1629 may overlap the lower voltage line 1110 of the first semiconductor layer 1100. The upper voltage line 1629 and the lower voltage line 1110 may function as the second initialization voltage line VAIL that transfers the second initialization voltage VAINT (refer to FIG. 2) to the first terminal of the seventh transistor T7.

In addition, the first metal layer 1600 may include connection electrodes each having an isolated shape. For example, the first metal layer 1600 may include a first connection electrode 1653, a second connection electrode 1651, a third connection electrode 1655, a fourth connection electrode 1657, and a fifth connection electrode 1659.

The first connection electrode 1653 may be connected to the first semiconductor pattern 1410 of the second semiconductor layer 1400 through a first contact hole CNT1 and may be connected to the second gate electrode 1220 of the first gate layer 1200 through a second contact hole CNT2. The second contact hole CNT2 may overlap the through hole 1330h penetrating the second capacitor electrode 1330 in a plan view. The first connection electrode 1653 may function as a connection electrode that connects the gate electrode of the first transistor T1, which is a driving transistor, and the first terminal of the third transistor T3, which is a compensation transistor, to each other.

The second connection electrode 1651 may be connected to the semiconductor pattern of the first semiconductor layer 1100 through a contact hole. The second connection electrode 1651 may electrically connect a data line 1710 (refer to DL of FIG. 2) to be described below and the first terminal of the second transistor T2 to each other.

The third connection electrode 1655 may be connected to the semiconductor pattern of the first semiconductor layer 1100 and the first semiconductor pattern 1410 of the second semiconductor layer 1400 through contact holes. The third connection electrode 1655 may electrically connect the second terminal of the third transistor T3 and the second terminal of the first transistor T1 to each other.

The fourth connection electrode 1657 may be connected to the semiconductor pattern of the first semiconductor layer 1100 through a contact hole. The fourth connection electrode 1657 may electrically connect a driving voltage line 1720 (refer to PL of FIG. 2) to be described below and the first terminal of the fifth transistor T5 to each other.

The fifth connection electrode 1659 may be connected to the semiconductor pattern of the first semiconductor layer 1100 through a contact hole. The fifth connection electrode 1659 may electrically connect a pixel electrode of the light-emitting diode ED (refer to FIG. 2) to the second terminal of the seventh transistor T7 and the second terminal of the sixth transistor T6.

The first metal layer 1600 may include a metal, an alloy, a conductive metal oxide, a transparent conductive material, or the like. For example, the first metal layer 1600 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The first metal layer 1600 may have a multi-layered structure, and for example, the first metal layer 1600 may have a two-layered structure of Ti/Al or a three-layered structure of Ti/Al/Ti.

A second interlayer insulating film 213 (refer to FIG. 12) may be on the first metal layer 1600. The second interlayer insulating film 213 may include an insulating material. For example, the second interlayer insulating film 213 may include an inorganic insulating layer, such as a layer of silicon oxide, silicon nitride, silicon oxynitride, or the like.

Figure 10:
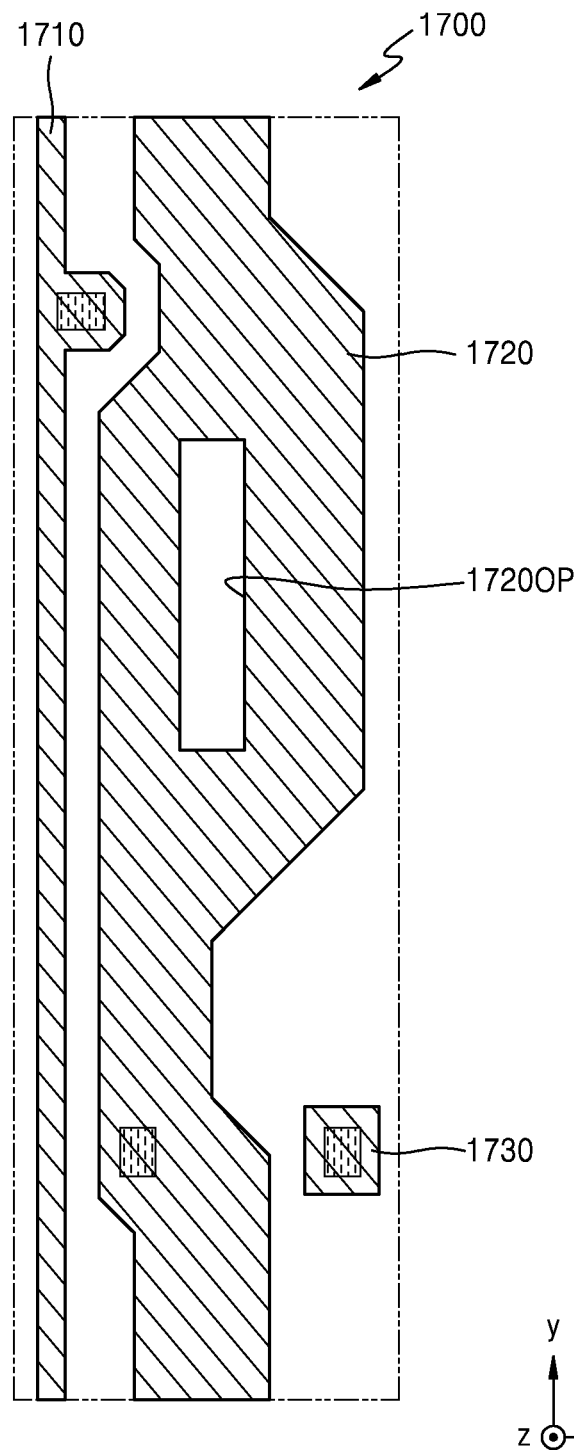

As shown in FIG. 10, a second metal layer 1700 may include the data line 1710 and the driving voltage line 1720, which extend in a second direction (a y-axis direction).

The data line 1710 may be connected to the second connection electrode 1651 of the first metal layer 1600 through a contact hole. The data line 1710 may transfer the data signal DATA (refer to FIG. 2) to the first terminal of the second transistor T2.

The driving voltage line 1720 may be connected to the fourth connection electrode 1657 of the first metal layer 1600 through a contact hole. The driving voltage line 1720 may transfer the first power voltage ELVDD (refer to FIG. 2) to the first terminal of the fifth transistor T5.

FIG. 11 shows only the driving voltage line 1720 and the first connection electrode 1653 to explain a positional relationship between the driving voltage line 1720 and the first connection electrode 1653. As shown in FIG. 11, the driving voltage line 1720 may have an opening 1720OP overlapping the first connection electrode 1653.

To reduce a parasitic capacitance between the driving voltage line 1720 and the first connection electrode 1653 positioned close to the driving voltage line 1720 in a thickness direction, the driving voltage line 1720 may define the opening 1720OP overlapping the first connection electrode 1653. When a parasitic capacitance by the driving voltage line 1720 is reduced, a voltage fluctuation value of the C node C (refer to FIG. 2) is transferred to the first node N1 (refer to FIG. 2) at a high transfer rate, and a luminance deviation of pixels may be reduced. In this regard, the opening 1720OP of the driving voltage line 1720 may have a rectangular shape. However, the disclosure is not limited thereto. A portion of the driving voltage line 1720 may have a loop shape surrounding the first connection electrode 1653. A boundary of the first connection electrode 1653 may be positioned inside the opening 1720OP of the driving voltage line 1720 in a plan view.

The driving voltage line 1720 requires a large area to reduce resistance and a voltage drop between a pixel close to the first power voltage supply line 15 (refer to FIG. 1) and a pixel far away from the first power voltage supply line 15. Accordingly, the driving voltage line 1720 may retain a large area by having the opening 1720OP exposing only a region overlapping the first connection electrode 1653.

Also, a constant voltage may be applied to the driving voltage line 1720 to shield an influence of voltage fluctuations of the data line 1710. For example, the driving voltage line 1720 may overlap the second gate electrode 1220, which is the gate electrode of the first transistor T1, in a plan view. The second gate electrode 1220, which is the gate electrode of the first transistor T1, may be positioned inside a boundary of the driving voltage line 1720 in a plan view. Also, in a plan view, as a portion of the driving voltage line 1720 is arranged between the first connection electrode 1653 and the fata line DL (refer to FIG. 3), an influence of voltage fluctuations of the data line 1710 on the first transistor T1 may be reduced.

The driving voltage line 1720 may overlap the third capacitor electrode of the boost capacitor Cost and the fourth capacitor electrode 1411 disposed on the third capacitor electrode in a plan view. In addition, the driving voltage line 1720 may overlap the upper gate electrode of the third transistor T3 and the upper gate electrode of the fourth transistor T4 in a plan view. Accordingly, the driving voltage line 1720 may sufficiently reduce an influence of voltage fluctuations of the data line DL.

The second metal layer 1700 may include a metal, an alloy, a conductive metal oxide, a transparent conductive material, or the like. For example, the second metal layer 1700 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The second metal layer 1700 may have a multi-layered structure, and for example, the second metal layer 1700 may have a two-layered structure of Ti/Al or a three-layered structure of Ti/Al/Ti.

Figure 13:
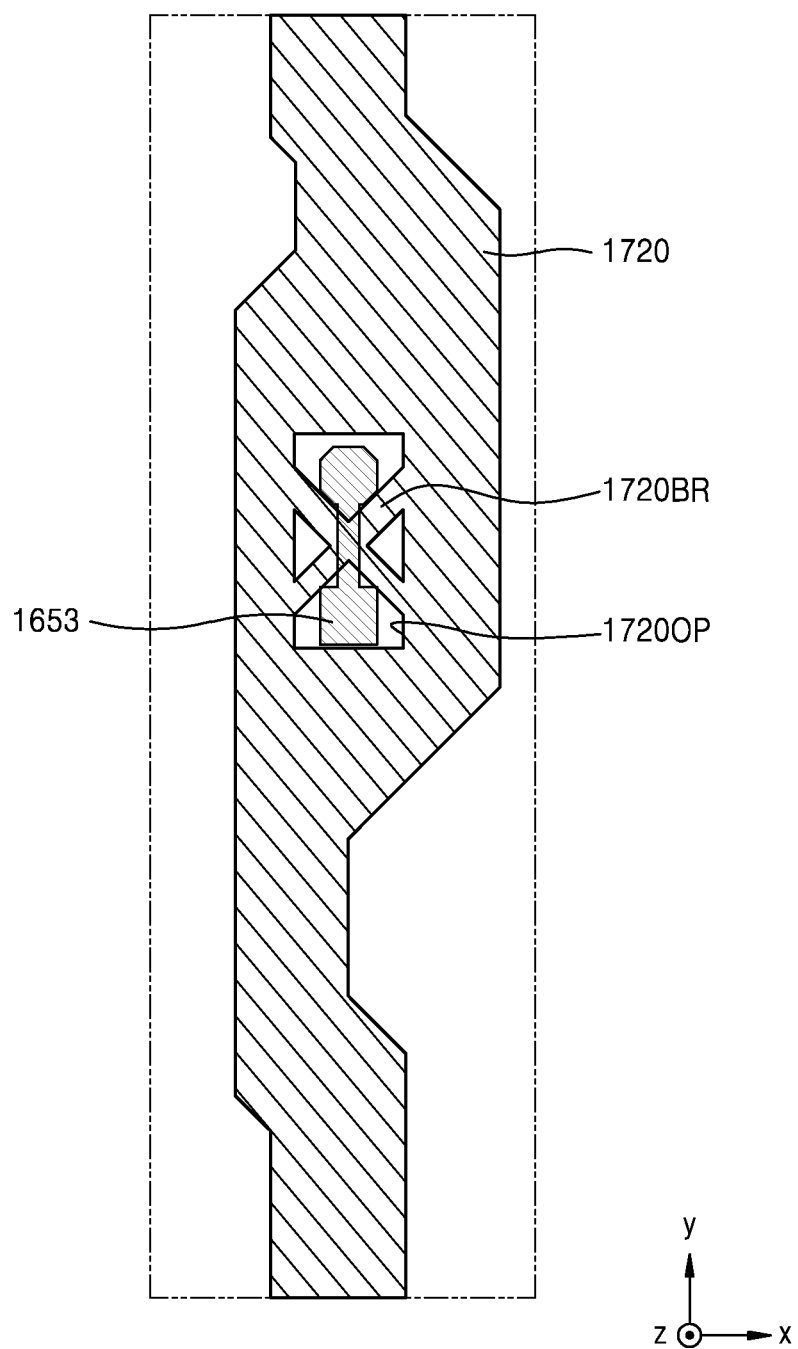
FIGS. 13, 14, and 15 are schematic plan views each illustrating a first connection electrode and a driving voltage line of a pixel of a display apparatus according to embodiments.
Figure 14:
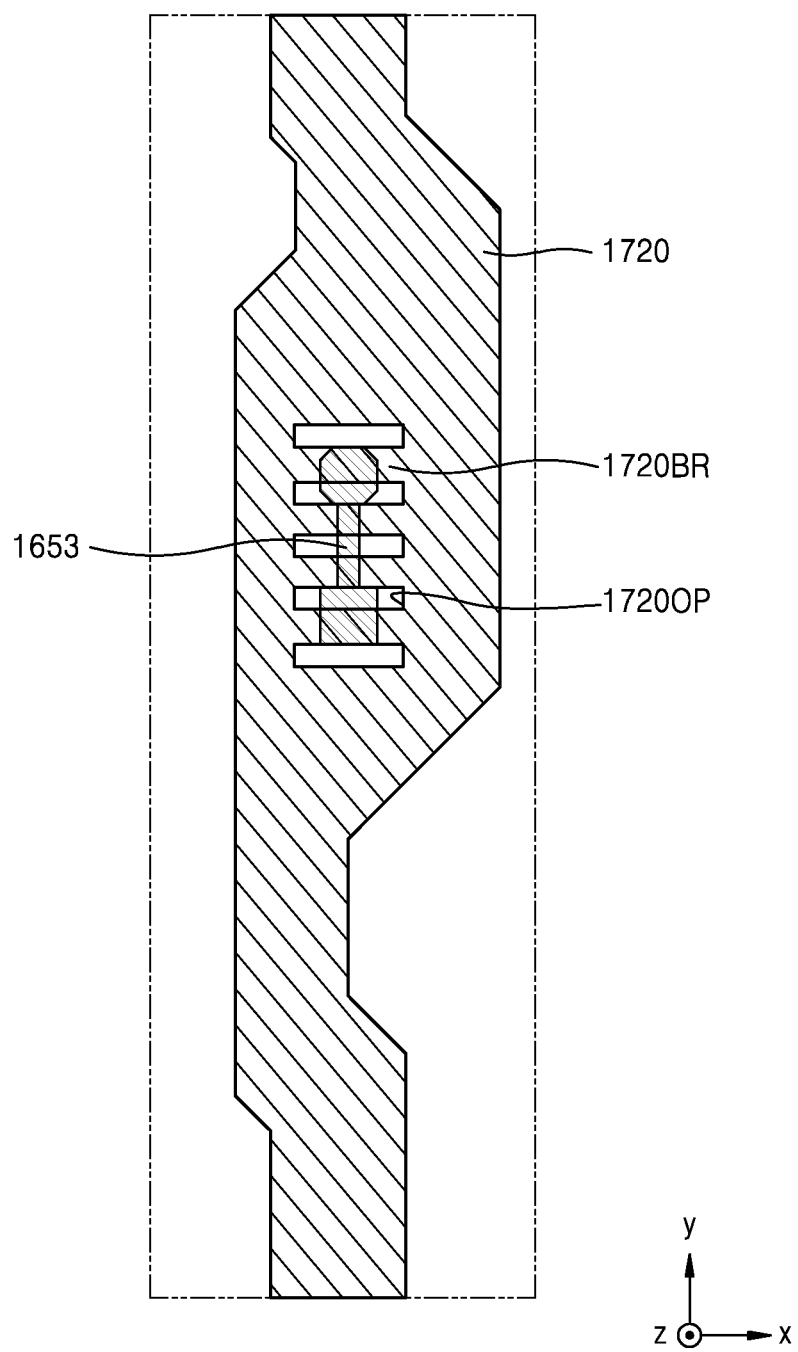
Figure 15:
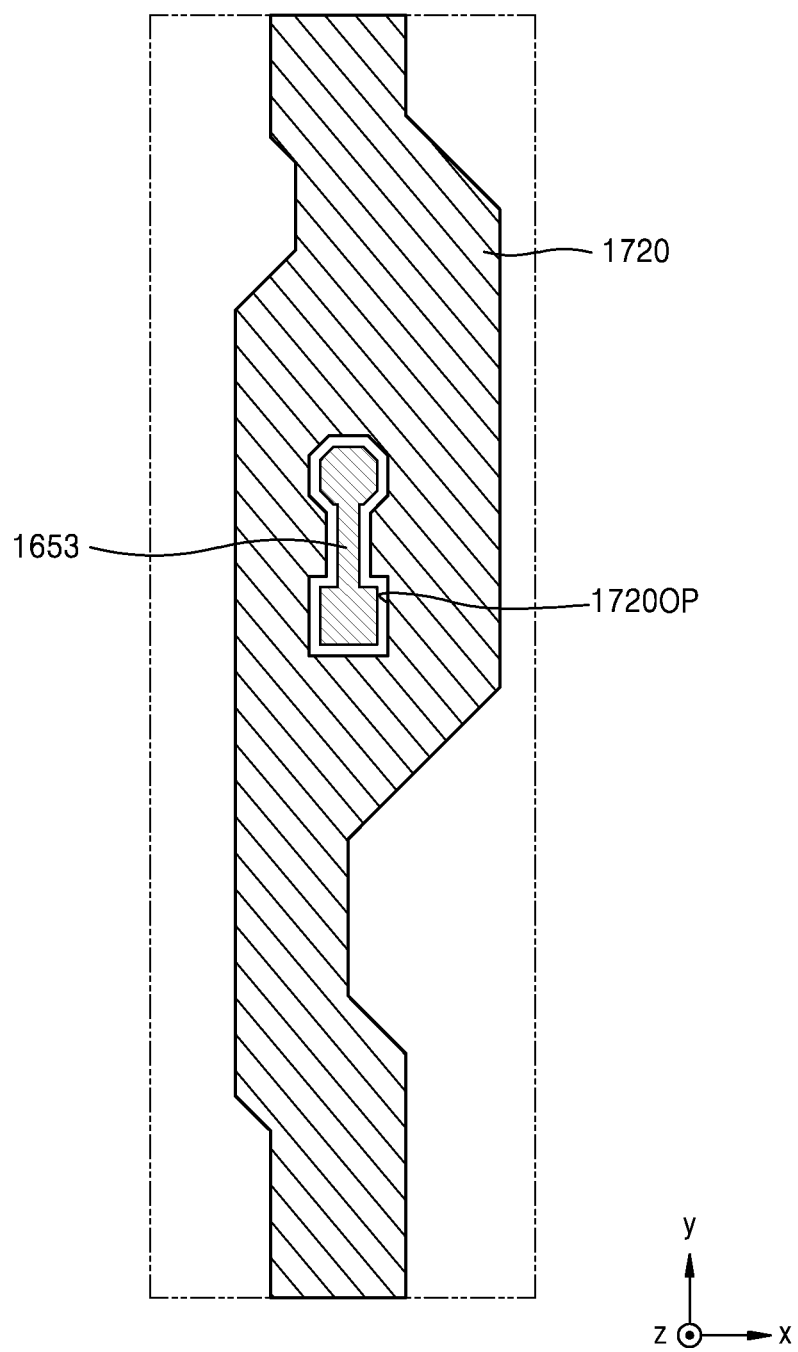

FIGS. 13 to 15 are schematic plan views each illustrating a connection electrode and a driving voltage line of a pixel of a display apparatus according to embodiments.

Referring to FIGS. 13 and 14, the driving voltage line 1720 may have the opening 1720OP overlapping the first connection electrode 1653 in a plan view. The opening 1720OP of the driving voltage line 1720 has a rectangular shape in a plan view, and the driving voltage line 1720 may further include bridge wires or conductive traces 1720BR each crossing the opening 1720OP.

As shown in FIG. 13, the bridge wires 1720BR may cross each other at a center of the opening 1720OP of the driving voltage line 1720. For example, the bridge wires 1720BR may cross each other in an X shape to divide the opening 1720OP of the driving voltage line 1720 into a plurality of sub-openings.

As shown in FIG. 14, the bridge wires 1720BR may be arranged to be spaced apart from each other in parallel to a first direction (e.g., an x-axis direction) intersecting or crossing over the first connection electrode 1653. The bridge wires 1720BR, which are parallel to each other, may divide the opening 1720OP of the driving voltage line 1720 into a plurality of sub-openings each having a rectangular shape.

As the bridge wires 1720BR cross the opening 1720OP of the driving voltage line 1720 and connect portions of the driving voltage line 1720 to each other, sheet resistance of the driving voltage line 1720 may be reduced. Each of the bridge wires 1720BR may have various shapes depending on a critical dimension and a step-difference in a thickness direction.

Referring to FIG. 15, in a plan view, a shape of the opening 1720OP of the driving voltage line 1720 may correspond to a shape of the first connection electrode 1653. In the disclosure, "the shape of A corresponds to the shape of B in a plan view" means that a boundary of A completely overlaps a boundary of B in a plan view, or points forming the boundary of A are outwardly or inwardly spaced apart from points forming the boundary of B by a certain distance.

For example, in a plan view, a boundary of the first connection electrode 1653 may completely overlap a boundary of the opening 1720OP of the driving voltage line 1720. Alternatively, as shown in FIG. 15, in a plan view, the boundary of the opening 1720OP of the driving voltage line 1720 may be outwardly spaced apart from a boundary of the first connection electrode 1653 by a certain distance. Accordingly, in a plan view, the boundary of the first connection electrode 1653 may be positioned inside the boundary of the opening 1720OP of the driving voltage line 1720.

As shown in FIG. 15, as the driving voltage line 1720 includes the opening 1720OP having a shape corresponding to the shape of the first connection electrode 1653, the driving voltage line 1720 may have a sufficient area to have low resistance while also reducing a parasitic capacitance caused by the first connection electrode 1653.

According to an embodiment described above, a display apparatus capable of displaying high-quality images may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a light-emitting diode;
   a driving transistor configured to control a driving current supplied to the light-emitting diode;
   a compensation transistor connected between a second terminal of the driving transistor and a gate electrode of the driving transistor and configured to compensate for a threshold voltage of the driving transistor;
   a compensation gate line connected to a gate electrode of the compensation transistor;
   a first connection electrode configured to connect the gate electrode of the driving transistor and a first terminal of the compensation transistor to each other; and
   a driving voltage line on an insulating layer covering the first connection electrode, covering the gate electrode of the driving transistor, and having an opening overlapping the first connection electrode,
   wherein an outer boundary of the first connection electrode is positioned inside the opening of the driving voltage line, and
   wherein the first connection electrode and the compensation gate line are spaced apart from each other in a plan view.

2. The display apparatus of claim 1, further comprising:
   a storage capacitor comprising a first capacitor electrode and a second capacitor electrode disposed on the first capacitor electrode to overlap the first capacitor electrode;
   a first switching transistor connected between the driving voltage line and a first terminal of the driving transistor; and
   a compensation reference transistor connected between a connection node line and a reference voltage line, wherein the connection node line connects the second capacitor electrode and a second terminal of the first switching transistor to each other.

3. The display apparatus of claim 2, wherein the compensation reference transistor is turned on according to an emission control signal controlling the first switching transistor.

4. The display apparatus of claim 2, wherein each of the compensation reference transistor and the compensation transistor comprises an oxide thin-film transistor, and
   each of the driving transistor and the first switching transistor comprises a silicon thin-film transistor.

5. The display apparatus of claim 2, further comprising a second switching transistor connected between the first switching transistor and the driving transistor,
   wherein a gate electrode of the first switching transistor is integrally provided with a gate electrode of the second switching transistor.

6. The display apparatus of claim 1, further comprising a boost capacitor comprising a third capacitor electrode connected to a first gate line and a fourth capacitor electrode disposed on the third capacitor electrode to overlap the third capacitor electrode,
   wherein the driving voltage line overlaps the third capacitor electrode and the fourth capacitor electrode.

7. The display apparatus of claim 1, wherein the driving voltage line overlaps a gate electrode of the compensation transistor.

8. The display apparatus of claim 1, further comprising:
   a first initialization transistor connected between a first initialization voltage line and the gate electrode of the driving transistor,
   wherein the driving voltage line overlaps a gate electrode of the first initialization transistor.

9. The display apparatus of claim 1, wherein the gate electrode of the driving transistor is positioned inside a boundary of the driving voltage line in a plan view.

10. The display apparatus of claim 1, wherein a portion of the driving voltage line is arranged in a region between a data line and the first connection electrode in the plan view.

11. The display apparatus of claim 10, wherein the data line and the driving voltage line are arranged on a same layer.

12. The display apparatus of claim 1, wherein the opening of the driving voltage line has a rectangular shape in the plan view.

13. The display apparatus of claim 12, further comprising bridge wires crossing the opening of the driving voltage line.

14. The display apparatus of claim 13, wherein the bridge wires cross each other at a center of the opening of the driving voltage line in the plan view.

15. The display apparatus of claim 13, wherein the bridge wires are spaced apart from each other and parallel to a first direction intersecting the first connection electrode.

16. The display apparatus of claim 1, wherein the opening of the driving voltage line has a shape corresponding to a shape of the first connection electrode in the plan view.

17. The display apparatus of claim 16, wherein the outer boundary of the first connection electrode overlaps a boundary of the opening of the driving voltage line in the plan view.

18. A display apparatus comprising:
- a first capacitor electrode;
- a second capacitor electrode on the first capacitor electrode to overlap the first capacitor electrode and having a through hole;
- a first connection electrode on the second capacitor electrode and electrically connected to the first capacitor electrode through the through hole of the second capacitor electrode; and
- a driving voltage line on the first connection electrode and having an opening overlapping the first connection electrode,
- wherein an outer boundary of the first connection electrode is positioned inside the opening of the driving voltage line, and
- wherein the first capacitor electrode is positioned inside an outer boundary of the driving voltage line in a plan view.

19. The display apparatus of claim 18, further comprising an oxide semiconductor layer on an insulating layer covering the second capacitor electrode,
- wherein the first connection electrode is electrically connected to the oxide semiconductor layer.

\* \* \* \* \*